US008217652B2

(12) United States Patent
Dannels

(10) Patent No.: US 8,217,652 B2
(45) Date of Patent: Jul. 10, 2012

(54) SPATIAL INTENSITY CORRECTION FOR RF SHADING NON-UNIFORMITIES IN MRI

(75) Inventor: Wayne R. Dannels, Mentor, OH (US)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 180 days.

(21) Appl. No.: 12/805,580

(22) Filed: Aug. 6, 2010

(65) Prior Publication Data

US 2012/0032676 A1   Feb. 9, 2012

(51) Int. Cl.
*G01V 3/00* (2006.01)
(52) U.S. Cl. ........................................................ 324/309
(58) Field of Classification Search .......... 324/300–322; 600/410–435
See application file for complete search history.

(56) References Cited

U.S. PATENT DOCUMENTS

| | | | |
|---|---|---|---|
| 4,713,614 A | 12/1987 | Hoshino | |
| 5,001,428 A | 3/1991 | Maier et al. | |
| 5,600,244 A | 2/1997 | Jensen et al. | |
| 5,726,571 A * | 3/1998 | Guclu et al. | 324/322 |
| 6,157,192 A * | 12/2000 | Cordes | 324/309 |
| 7,218,107 B2 | 5/2007 | Fuderer | |
| 7,411,396 B1 * | 8/2008 | Schirmer et al. | 324/309 |
| 7,417,430 B2 * | 8/2008 | Aldefeld et al. | 324/309 |
| 7,432,707 B1 | 10/2008 | Boitano | |
| 7,576,536 B2 * | 8/2009 | Akao et al. | 324/307 |
| 8,093,894 B2 * | 1/2012 | Machida et al. | 324/307 |
| 2012/0032677 A1 * | 2/2012 | Dannels | 324/309 |

OTHER PUBLICATIONS

U.S. Appl. No. 12/382,605, Dannels, et al.
Arnold, et al., "Qualitative and Quantitative Evaluation of Six Algorithms for Correcting Intensity Nonuniformity Effects," *NeuroImage*, vol. 13, pp. 931-943 (2001).
Bernstein, et al., "Imaging Artifacts at 3.0T," *JMRI*, vol. 24, pp. 735-746 (2006).
Clare, et al., "Compensating for $B_1$ Inhomogeneity Using Active Transmit Power Modulation," *Mag. Reson. Imaging*, vol. 19, pp. 1349-1352 92001).
Collins, et al., "Central Brightening Due to Constructive Interference With, Without, and Despite Dielectric Resonance," *J. Mag. Reson. Imaging*, vol. 21, pp. 192-196 (2005).
Franklin, et al., "Improvement in B1-Inhomogeneity Artifacts in the Abdomen at 3T MR Imaging Using a Radiofrequency Cushion," *J. Mag. Reson. Imaging*, vol. 27, pp. 1443-1447 (2008).
Hou, "A Review on MR Image Intensity Inhomogeneity Correction," *Intl. J. Biomed. Imaging*, vol. 2006, pp. 1-11 (2006).
Ibrahim, et al., "Effect of RF Coil Excitation on Field Inhomogeneity at Ultra High Fields: A Field Optimized TEM Resonator," *Magn. Reson. Imaging*, vol. 19, pp. 1339-1347 (2001).
McVeigh, et al., "Phase and Sensitivity of Receiver Coils in Magnetic Resonance Imaging,"*Med. Phys.*, vol. 13, pp. 806-814 (1986).
Mitsumori, et al., "Apparent Transverse Relaxation Rate in Human Brain Varies Linearly with Tissue Iron Concentration at 4.7T," *Magn. Reson. Med.*, vol. 58, pp. 1054-1060 (2007).

(Continued)

*Primary Examiner* — Dixomara Vargas
(74) *Attorney, Agent, or Firm* — Nixon & Vanderhye PC

(57) ABSTRACT

An MRI MAP prescan data from a predetermined imaged patient volume is decomposed to produce a transmit RF field inhomogeneity map and a receive RF field inhomogeneity map for the imaged patient volume based on a three-dimensional geometrical model of the inhomogeneity maps. At least one of the transmit RF field inhomogeneity map and the receive RF field inhomogeneity map is used to generate intensity-corrected target MRI diagnostic scan image data representing the imaged patient volume.

20 Claims, 5 Drawing Sheets

OTHER PUBLICATIONS

Murakami, et al., "Intensity Correction of Phased-Array Surface Coil Images," *Magn. Reson. Med.*, vol. 35, pp. 585-590 (1996).

Sled, et al, "Standing-Wave and RF Penetration Artifacts Caused by Elliptical Geometry: An Electrodynamic Analysis of MRI," *IEEE Trans. Med. Imaging*, vol. 17, pp. 653-662 (1998).

Sled, et al., "A Nonparametric Method for Automatic Correction of Intensity Nonuniformity in MRI Data," *IEEE Trans. Med. Imaging*, vol. 17, pp. 87-97 (1987).

Storey, et al., "B1 Inhomogeneity in the Thigh at 3T and Implications for Peripheral Vascular Imaging," *Proc. Intl. Soc. Mag. Reson. Med.*, vol. 17, abstract #425 (2009).

Thomas, et al., "High-Resolution Fast Spin Echo Imaging of the Human Brain at 4.7T: Implementation and Sequence Characteristics," *Magn. Reson. Med.*, vol. 51, pp. 1254-1264 (2004).

Wang, "Measurement and Correction of Transmitter and Receiver Induced Nonuniformities in Vivo," *Magn. Reson. Med.*, vol. 53, pp. 408-417 (2005).

Zhai, et al., "B I Mapping for 3T Body Imaging," *Proc. Intl. Soc. Magn. Reson. Med.*, vol. 14, abstract #1389 (2006).

Zhang, et al., "Reduction of Transmitter $B_1$ Inhomogeneity with Transmit SENSE Slice-Select Pulses," *Magn. Reson. Med.*, vol. 57, pp. 842-884 (2007).

* cited by examiner

3D-Head shape model

Head model = c1 + c2 exp $[-0.5\,(((x-c3)/c6)^2 + ((y-c4)/c7)^2 + ((z-c5)/c8)^2\,)]$

3D-Body shape model

Body model = c1 + c2 exp $[-0.5\,(((x-c3)/c6)^2 + ((y-c4)/c7)^2\,)]$

SPATIAL INTENSITY CORRECTION FOR RF SHADING NON-UNIFORMITIES IN MRI

FIELD

The subject matter below relates generally to magnetic resonance imaging (MRI) processes providing image intensity corrections for image shading artifacts caused by non-uniform radio frequency (RF) magnetic field distributions within an imaged patient volume. The intensity corrections herein described are especially useful for higher field (e.g., 3.0 T) MRI systems, where higher frequency RF fields having shorter wavelengths possibly on the order of patient anatomy dimensions present special problems.

DETAILED DESCRIPTION

Figure 1:
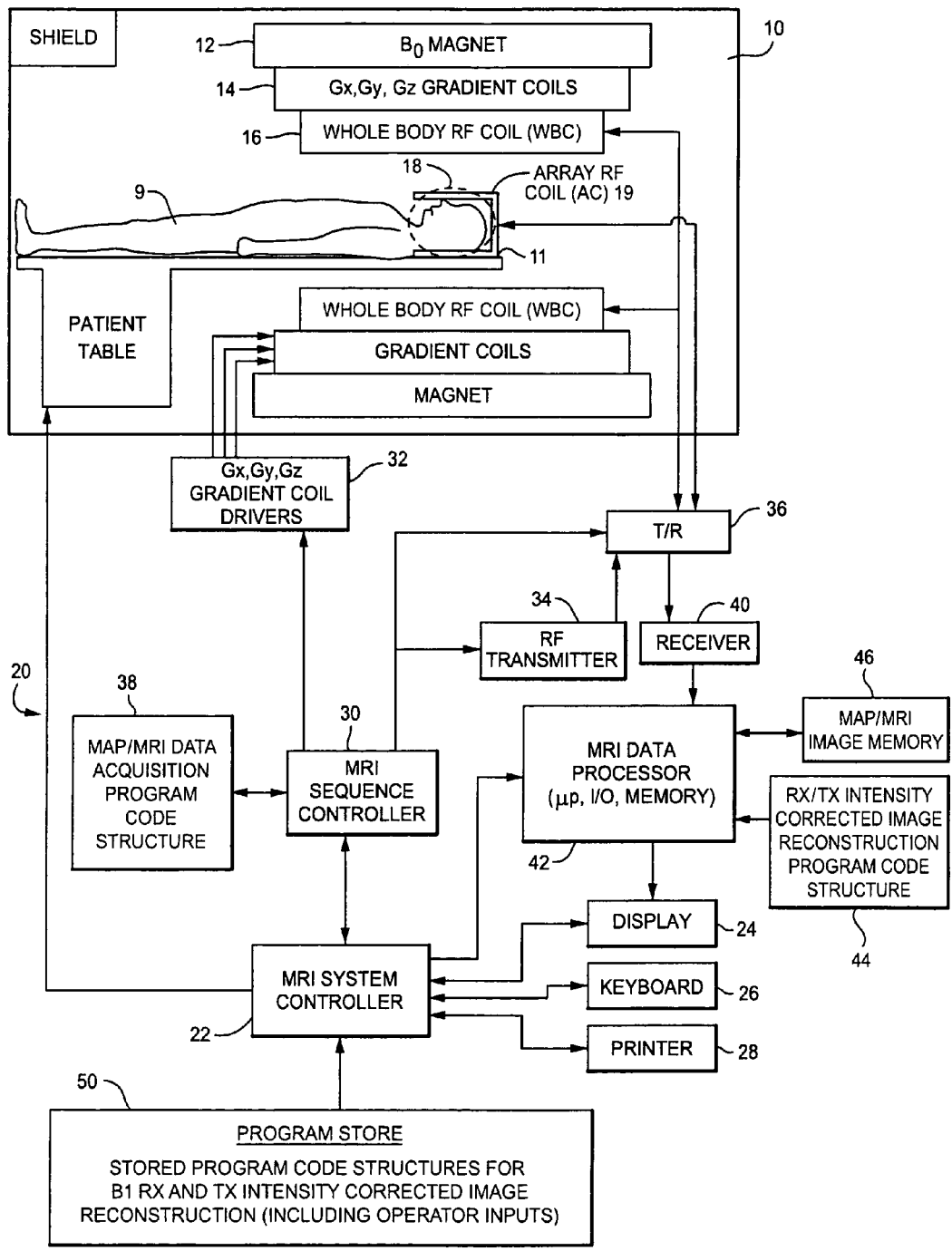
FIG. 1 is a high-level schematic block diagram of an MRI system adapted to acquire and process intensity correct MRI target image data for non-uniform TX and RX RF fields.

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field BO magnet 12, a $G_x$, $G_y$, and $G_z$ gradient coil set 14 and a large whole body RF coil (WBC) assembly 16. Along the horizontal axis of this cylindrical array of elements is an imaging volume 18 shown as substantially encompassing the head of a patient 9 supported by a patient table 11. A smaller array RF coil (AC) 19 is more closely coupled to the patient head in image volume 18. As those in the art will appreciate, compared to the WBC, relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC).

An MRI system controller 22 has input/output ports connected to display 24, keyboard 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$, and $G_z$ gradient coil drivers 32, as well as the RF transmitter 34 and the transmit/receive switch 36 (if the same RF coil is used for both transmission and reception). The MRI sequence controller 30 includes suitable program code structure 38 for implementing MAP data acquisition sequences (e.g., a relatively low resolution prescan image that provides a map of MRI response intensities) in conjunction with other (e.g., conventional diagnostic) MRI sequences already available in the repertoire of the MRI sequence controller 30.

The MRI system 20 includes an RF receiver 40 providing input to data processor 42 so as to create processed image data to display 24. The MRI data processor 42 is also configured for access to receive/transmit (RX, TX) B1 RF intensity-corrected image reconstruction program code structure 44 and to MAP and MRI image memory 46 (e.g., for storing image data derived from processing in accordance with the exemplary embodiments and the B1 intensity-corrected image reconstruction program code structure 44).

Also illustrated in FIG. 1 is a generalized depiction of an MRI system program store 50 where stored program code structures (e.g., for B1 RX and TX intensity-corrected image reconstruction, operator inputs to same, etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of a B1 intensity-corrected imaging reconstruction process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaged volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

The exemplary embodiments described below provide improved ways to process data acquisitions and/or to generate and display MR images.

There is a need to correct for non-uniformity in target MRI images caused by non-uniform RF fields within the imaged tissue—both for transmitted and received signals. The present processes reduce image non-uniformity (e.g., shading) caused by spatial non-uniformity in the RF fields: both RF-TX (transmit field) and RF-RX (receive field). These sources of non-uniformity are more significant at 3.0 T than at 1.5 T (e.g., because applicable shorter RF wavelengths can result in constructive and/or destructive interference within patient cavities and/or tissues being imaged). There is much literature about RF-field non-uniformity effects. Many methods are known for surface coil RF receive non-uniformity corrections, and many methods correct, at least in part, image non-uniformity caused by transmit RF non-uniformity.

Some conventional algorithms collect additional reference scans with both the array coil (AC) in RF receive mode and with the whole body coil (WBC) in RF receive mode. A ratio of the images is formed, pixel-by-pixel. Then target images can be corrected by multiplying by this ratio. This correction causes the AC image to have spatial uniformity approximately equal to the WBC image uniformity.

For example, a conventional intensity correction process may run a single FE (field echo) MAP prescan acquisition, which collects two volumes. Acquisitions are interleaved to make motion artifact differences minimal. One volume uses WBC as a receive coil, and one volume uses AC as a receive coil. A diagnostic acquisition is run for the scan to be corrected (the target scan), which is reconstructed in the normal way as part of the scanning operation (or alternatively, reprocessing can be performed later in a post-processing mode). The operator selects intensity correction on and enters a number for percent of correction, e.g., perhaps 0<=(percent correction)<=100).

The two MAP volumes are divided so that a ratio is formed on a pixel-by-pixel basis. In the ratio, TX effects and signal density should be the same for both factors in the ratio, so only RX effects remain in the ratio.

If the assumption is made that WBC RF field is spatially uniform, then the ratio image volume "R" depends only upon the AC RX spatial pattern (and perhaps a constant gain factor). A slice is extracted from the R image volume by a process like multi-planar reformatting so that the slice has the same pixel locations as the target image. When the target image is multiplied by the ratio slice, the RX AC pattern in the target slice is cancelled (or it is replaced by the RX WBC pattern when that pattern is not spatially uniform). Such an intensity correction should create an image that has the local SNR of an AC image, but which has the spatial non-uniformity of a WBC image.

In some prior approaches, the scanner determines a characteristic from an image (for example, a width of a human body cross-section, or a ratio of a width and height). Then a correction map is selected from a stored database, perhaps from among a plurality of stored maps, the choice being dependent upon the image characteristic. The map is then used to correct image non-uniformity.

Many techniques are known for generating maps of the effective RF-TX field in a subject. When such a map has been acquired, several methods exist to correct an image for RF-TX non-uniformity artifacts.

Some pure image processing methods attempt to make images have flat intensity profiles, without any use of calibration data or prescan maps.

However, while using WBC as a reference image and then assuming improved uniformity from the WBC may cause only small errors on 1.5 T images (which may be acceptable), non-uniformity causes much larger errors on 3.0 T images, which are not acceptable.

Prior attempts to provide MR intensity correction have included: hardware improvements, such as B1 shimming; modified MRI sequences so as to be less sensitive to TX RF levels; pure image processing corrections; added calibration measurement scans per patient; use of big uniform coils (quadrature WBC) to correct smaller, less-uniform coils; RF field calculations based on electromagnetic models; and predetermined correction maps created in advance for "typical patients". The prior correction processes adopted for 1.5 T MRI systems (and lower) are generally not acceptable at higher fields (e.g., 3.0 T MRI). For example, body images may be under-corrected while head images are over-corrected.

The whole body coil (WBC) is used as a reference because it contains less structure and spatial variation relative to the anatomy than array receive coils (AC). In heads being imaged by 3.0 T MRI systems, the TX and RX fields are more intense in the center (higher than around the edges). In bodies, especially for larger subjects, the TX and RX fields of the WBC in the center of the body may be too low (lower compared to the edges). With the standard reconstruction methods, the effect of the WBC RX field non-uniformity will change the reconstructed image intensity by a simple linear relationship (higher RX locally gives brighter pixels locally). For TX spatial non-uniformity, the relationship between RF field non-uniformity and image brightness is much more complicated. TX non-uniformity effects depend upon the pulse sequence, sequence parameters, tissue T1 and T2, RF calibration and even more factors. Depending upon these factors, the TX effect of RF non-uniformity may be stronger than the RX effect, weaker, or may be almost no effect at all.

Simple fixed correction models will not always be accurate. For example, if RF fields are chosen from stored models based on body dimensions, they will not be very good for patients with different body tissue composition, such as more fluid or more fat. Also, the dependence on RF-TX fields will be different when pulse sequence parameters are changed, and it becomes problematic to store correction for a wide range of acquisition sequences and parameters.

RF-TX corrections with explicit RF-TX maps typically require extra scans which are slow or inaccurate for volume 3D correction data. No good method is known to directly acquire a pure and accurate RF-RX map inside the human body, especially if one requires a fast 3D method and few or no prior fixed assumptions about human electrical and MR tissue properties. RF transmit fields and receive fields both are spatially non-uniform, especially at 3.0 T or higher. Needed uniformity correction patterns vary from specific patient to specific patient.

The exemplary processes described below may be implemented so that the system operator experiences a GUI similar to what the operator uses for existing reconstruction intensity correction algorithms. Basically the same kind of prescan and prescan protocols may be used as in existing intensity corrections.

The exemplary processes here described include two correction parts. One part reduces B1 RX effects of non-uniformity and the other part reduces B1 TX effects of non-uniformity. The physical purpose of the older existing correction was to reduce non-uniformities from only the receive AC design. The AC have sensitivity patterns arising from the Biot-Savard law in electricity and magnetism physics, and these coils are usually designed to trade away spatial uniformity in exchange for increased local SNR.

The exemplary processes described below remove main shading effects caused by TX RF and RX RF field non-uniformities without changing image features that come from pathology—while using the usual already available prescan MAP image, thus requiring no additional prescan.

In accordance with the described exemplary embodiments, B1 TX and RX intensity corrections can be effected by:

Choosing a geometry model for general anatomy types such as head or body. For 3.0 T, gross TX and RX patterns are assumed to be similarly shaped so that one MAP image fitted to one model is usable to derive an estimate of both body coil TX and body coil RX central shading.

Collecting MAP prescan data on a specific patient, with large WBC (as is typically already done anyway).

Fitting geometry shape parameters for a selected model to MAP prescan data (including separated TX and RX effects) to provide a joint TX/RX approximate correction MAP for this specific patient.

Applying new TX correction to a target image to be corrected.

Correcting body coil RX pattern using joint RX/TX fitted map and then applying an array coil RX correction (e.g., using conventional correction algorithm).

This B1 intensity correction process provides many improvements, such as:

No hardware changes are required and no extra MAP prescan is required.

Basic central shading is removed from multiple sources (e.g., from WBC RF TX patient pattern, from WBC RF RX pattern, from AC geometric patterns, etc.).

Anatomical features from scan pathology are not changed.

Many factors are adjusted for, including: particular patient size, shape, location in scanner, amount of fat, amount of conductive body fluids, etc.

Basic distinct TX effects can be supported for a wide variety of MRI pulse sequences.

Intensity errors exceeding 25% in uncorrected heads (even larger in bodies) can be reduced to less than about 10% remaining error.

In MRI, an NMR (nuclear magnetic resonance) RF response signal is generated by transmitting penetrating RF fields into patient tissue. Received RF fields (or, more exactly, the oscillating magnetic field component of the electromagnetic field) result from NMR phenomena and emanate from within the imaged tissue. The signal will be interpreted as a measurement of some detectable MR substance, or of the properties of that substance (which can be called "MR parameters"). At higher field strengths (e.g., 3.0 T), penetration effects or wavelength interference effects prevent these fields from having good spatial uniformity across a human body or across a portion of a body such as a head. The reconstructed image depends upon the detected RF signal and, therefore, its brightness will be affected locally by the intensity variations in both the transmit RF magnetic field and the receive RF magnetic field.

An uncorrected image will, therefore, have various factors (such as penetration and wavelength diffraction effects) changing brightness of imaged tissue. Such spurious brightness effects are not of interest to the person using the image. Worse yet, these spurious image variations from effects that are not of primary interest have the potential to be misinterpreted. Areas of altered signals caused by inhomogeneities in RF signal could either obscure the detection of meaningful MR local signal changes or could be wrongly interpreted as local changes in the MR parameters of interest.

The RF intensity-corrected processes described below significantly reduce effects of RF spatial inhomogeneity from magnetic resonance images.

A conventional, low resolution MAP scan is acquired with a known coil such as a WBC (whole body coil) and with known pulse sequence parameters. This MAP scan image is fitted to a shape model. The fitted shape MAP image pixel values are decomposed into a non-uniformity component part caused by RX (receive) effects, and a non-uniformity component part caused by TX (transmit) effects.

Assuming that the TX and RX spatial maps are similar (e.g., using the same shape model for both) allows generation of both an RF-RX MAP and an RF-TX MAP for the WBC, utilizing the MAP scan.

These are used to generate an improved RX uniformity correction map and to create a new TX correction map suitable for correcting diagnostic MRI data acquisition scans. Decomposing a single acquired MAP into usable TX and RX correction map components is considered an important step—as is fitting acquired MAP scan data to a simple, generalized, smoothly varying 3D shape model to extract basic non-uniformity model parameters, such as the strength of increased central RF in the head, or the strength of decreased central RF in the body, e.g., by adjusting width and center parameters of that shape.

In brief, a basic geometrical shape is fitted to the image intensity of the WBC map volume, something like a broad Gaussian plus a uniform constant. Then an estimate is made of how to decompose that image intensity into two components, a TX effect component, and a RX effect component.

From the prescan MAP (or its general fitted shape), one can compute estimates of either the TX effect or the RX effect in the WBC MAP (or both). Since the RX image inhomogeneity effect on the WBC is the same as the B1 RX field map itself (a simple linear relationship exists between them), this provides an estimate of the B1 RX field map. And it can be assumed that the B1 RX map is about the same as the B1 TX map, and that B1 RX map can be used as an estimate for the B1 TX map.

This new estimated TX or RX map is used as a correction for the WBC map in the ratio correction for receive coil sensitivities.

Also, the TX or RX map estimate is used with a signal strength model for the MRI sequence used to acquire the target image. This model is similar to performing Bloch equations simulation for some typical tissue parameters with RF pulse angles that deviate from the specified ideal angles by a factor of the TX B1 map. This map is not perfect, but in first testing, it removes at least some TX error from many realistic clinical pulse sequences. A correction factor map is generated and then used as a multiplicative factor.

These RF maps and other intermediate computations could be generated for any of many different slice geometries. One can choose voxel sizes for intermediate calculations. Choosing convenient geometries makes the computations faster or simpler. Doing computations with the resolution of the MAP (or with smaller arrays) can be a way to speed up the algorithms. Resampling volumes to be isotropic can remove some geometry calculations from the fitting step. At some point in the algorithm flow, it is necessary to convert from the pixel geometry of the MAP to the pixel geometry of the target image. These geometric conversions could be done at any of many steps. They involve tradeoffs between memory size or storage, number of pixels that must be calculated (calculation time), complexity of some geometry calculations, resolution and interpolation error. The order in which some of these steps are performed can be changed—as can the sizes. The order of geometry operations used as described herein are reasonable, but not essential, and they might not be optimal.

Of course, spatially dependent distortions of MRI images (whether such distortion errors manifest themselves as intensity errors or in spatial distortion) also arise from imperfections in the main magnetic field or from the gradient fields. The intensity corrections herein discussed pertain to the RF fields (both TX and RX), and not to non-uniformities caused by either the gradient fields or the main static magnetic field.

The subsequent main or diagnostic scan to be corrected is herein sometimes called the "target scan". Its results are of primary interest, and it is the target to be transformed by the correction processes.

Figure 2:
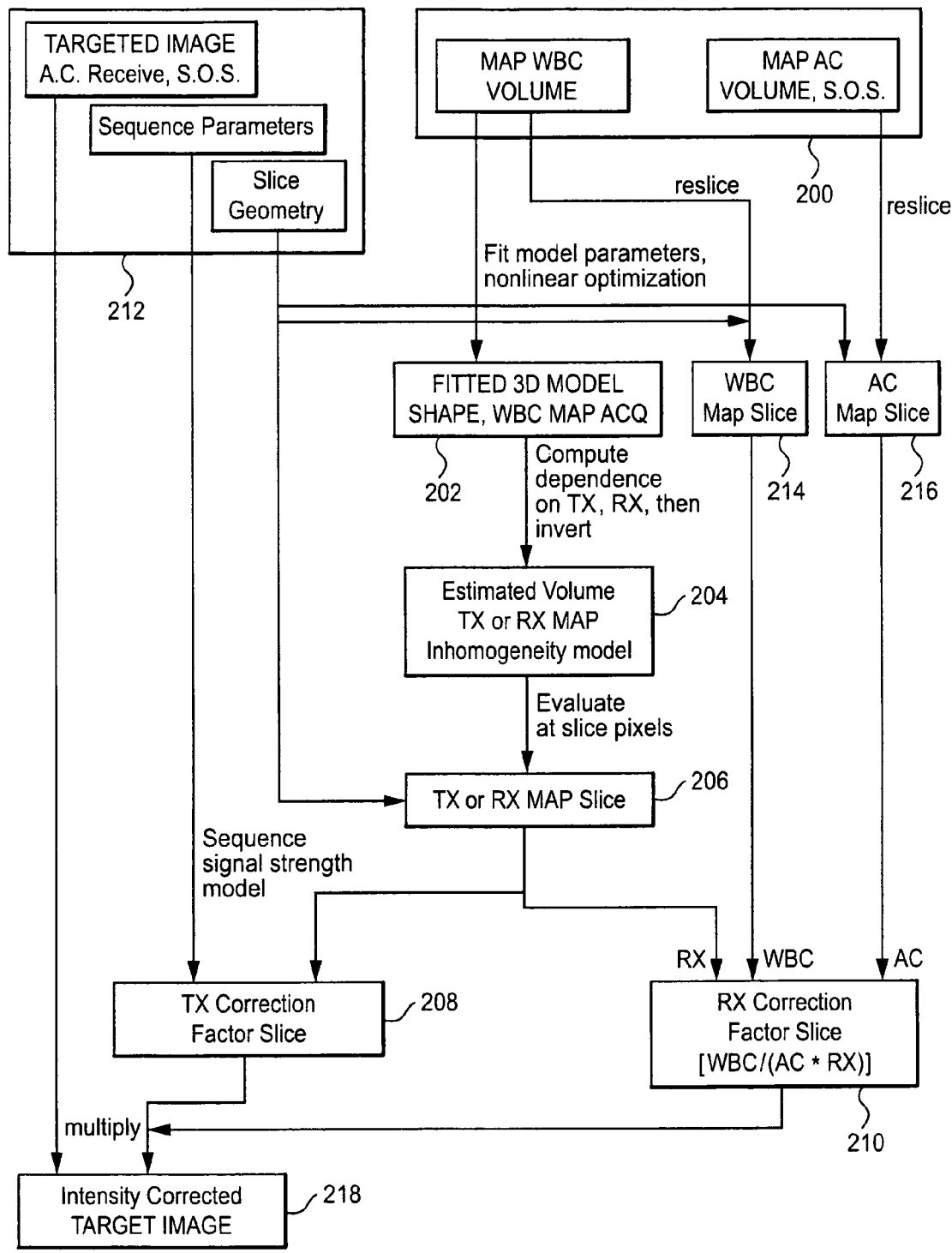
FIG. 2 is a schematic diagram illustrating some aspects of exemplary intensity correction processes.

FIG. 2 schematically depicts an exemplary process for correcting both TX effects and RX effects in an AC-receive only image.

At 200, MAP scan acquisitions are effected covering a volume that includes at least the volume of the subsequent target image. The MAP scan acquisitions include both a WBC-RX image and an AC-RX image of the subject (i.e., of the patient's anatomy area of interest). Some plausible MRI parameters for this acquisition might include a TR interval of 200 milliseconds, a TE interval of 2-4 milliseconds, a conventional sequence type (field echo, 2DFT multi-slice), flip angle of 20-40°, spatial resolution about 1 cm, number of slices=20-45. However, none of these parameters or choices is essential; they are only exemplary. The MAP scans might be otherwise already available, regardless of whether non-uniformity correction is about to be applied if it were needed for other purposes such as parallel imaging reconstruction (SPEEDER, SENSE, or the like).

The AC volume image, in particular, may be synthesized from signals of multiple coil elements or multiple receiver channels, perhaps using the Sum-Of-Squares combination algorithm, as is well known in the art.

The operator may indicate a general anatomy of interest (e.g., the head). Alternatively, this might be otherwise inferred from information such as the AC coil being used, or this information may already be specified for other purposes such as SAR (specific absorption rate) calculations, regardless of whether the RF non-uniformity correction is about to be performed.

Using the anatomy designation, a generalized 3D shape model is selected for the expected general structure of the RF non-uniformity pattern. At 3.0 T, the simplifying assumption is made that the same fundamental shape model will be used both for RF-TX non-uniformity patterns and for RF-RX non-uniformity patterns. The anatomy designation can also be used to select nominal tissue parameters such as T1 and T2 that are usual for that anatomy at, for example, 3.0 T.

At 202, a fitting process (preferably optimized) is performed so that the shape model is adapted to fit to the WBC MAP scan data. Variable parameters in the shape model are preferably chosen to have values such that an optimal fit is achieved, or so that a minimized error deviation results between the fitted model and the WBC-RX MAP scan data for this particular patient.

As an example, one suitable model for head imaging could involve parameters such as a spatial constant, plus an additive central brightness that is specified as a 3D-Gaussian shape. The widths of the Gaussian shape along three orthogonal directions, plus its center position, describe the expected shape. There might be, in such an example, about eight free parameters. These parameters may be: (1) a basic uniform intensity over the entire volume, (2) the additive intensity to achieve a central enhanced peak, (3-5) widths of the spatially-dependent additive peak along three axes, and (6-8) center position coordinates of the peak along three axes. The same shape might be described with fewer parameters. For example, the central shape may be given as a relative intensity with respect to some normalized or asymptotic intensity, in which case the first two parameters previously described could be replaced by .a single parameter (plus a normalization step).

The fitting process will return at 202, in this example, values for eight shape model parameters. The fitting step may be performed with an algorithm such as the Nelder-Mead optimization algorithm. A convenient description and implementation of such an algorithm is given in "Numerical Recipes in C" (authors W. H. Press, B. P. Flannery, S. A. Teukolsky and W. T. Vetterling, Cambridge University Press, 1988). Numerous optimization and fitting algorithms are known, and the choice of the specific algorithm is not considered to be essential.

At 204, based on the nominal parameters of the MAP scan, and on the nominal MR parameters expected for the subject, an estimate can be constructed to show how the MAP scan's intensity is expected to depend upon the local inhomogeneity of the TX and RX fields. Here, use can be made again of the simplifying assumption that the TX field and the RX field exhibit similar shape patterns. One spatial distribution shape can be used for both RX and TX.

An important element at this step is that a decomposition of the TX and RX effects can be performed so that a given amount of inhomogeneity in the MAP scan can be ascribed to two parts, and the magnitude of each of the two parts can be determined. The exact way in which this is done is not essential.

As an example, consider that an intensity equation can be given for field echo (FE) pulse sequences where the intensity corresponds to the amount of transverse magnetization during readout time (at some location). When the MAP scan is such a field echo scan, the signal intensity due to TX inhomogeneity can be generated, by using an alternate NMR excitation flip angle that is the nominal flip angle times (1+x), where "x" is the relative TX RF inhomogeneity. A first derivative of the signal strength "T" for the TX factor in the map scan sequence can be estimated in this way. Since the observed signal at the RX coil depends upon both the TX and the RX effects, a total signal dependence (including both TX and RX) can be estimated to have a derivative with respect to "x" of about "1+T". From this, one can estimate that the RF inhomogeneity X at any given location is approximately (1/(1+T)) times the local signal deviation in the MAP scan (relative to an appropriate tissue baseline signal).

It is preferable to apply the decomposition to the fitted signal (output of step 202) to estimate an RF field MAP. It is also plausible that the decomposition could be applied directly to the WBC image normalized to some baseline, for example. Such a variation could yield spurious local structure, but this might be removed, for example, by image processing steps such as filtering, masking, extrapolation and the like.

Other methods may also be used for determining an exact way to decompose the fitted MAP scan signals into TX and RX components. A table of discrete pairs could be generated. A polynomial representation could be fitted, and that polynomial inverted. Analytical formulas might be found for the signal dependence, and for the inversion of the signal dependence. As opposed to representing an explicit inverse to relate X back to relative image intensity, it is possible to use the forward dependence equation plus a root-solver. Alternately, direct simulation of the Bloch equations could be performed instead of using known pulse sequence signal equations, etc.

In any event, from the MAP scan, and from its known properties, a way is provided to estimate an RF-field inhomogeneity effect that is functionally related to the local signal inhomogeneity in the MAP scan, which estimate provides an effective decomposition of the total MAP scan inhomogeneity into both a TX RF inhomogeneity part and an RX inhomogeneity part.

At 206, an RF inhomogeneity map slice is generated, by extracting values at pixel locations from the volume map which was the output of step 204. The geometry of this slice is preferably identical to the geometry of the target slice. The basic mathematical operation at this step is fundamentally an interpolation.

It should be appreciated that steps 202 and 204 can be performed once for the entire correction. In fact, performing steps 202 and 204 once on a map acquisition can suffice for correcting a variety of distinct target acquisitions. Step 206 will be performed however, at least for each slice with distinct geometry for each target acquisition to be corrected.

An RX correction map is generated at step 210, which contains two terms: (1) the RX non-uniformity map slice that may be in the form of a parametric model, as opposed to the form of a volume of discrete pixel values, and (2) the ratio of the WBC image and the AC image from the correction scan that may be filtered and masked, etc. In the most basic case, this correction map is the pixelwise result obtained by taking the WBC map pixel value, and dividing by the AC map pixel value and the TX or RX RF map value. This basic result may be further modified by changing the strength of the correction based upon a correction percentage factor supplied by the operator, or by filtering, or by clamping extreme correction values, and so forth.

A TX correction MAP is generated at step 208, which is made by using the TX RF inhomogeneity MAP (output of step 204). The TX inhomogeneity map is converted into correction values by using the signal equations and applying them to altered RF transmit pulses, which is exactly analogous to the sub-step where a functional relationship is made between the RF TX field and the TX image intensity effects in the MAP scan. But here, the pulse sequence to be used is the "target scan", not the MAP scan. Thus, a different signal equation might be used (for example, an "SE" (spin echo) or "FSE" (fast spin echo) signal equation), and there will, in general, be different sequence parameters, such as different TE, different TR and the like.

The RX correction factor slices and TX correction factor slices (from 210 and 208) are applied to the target scan slices, to generate the corrected target image, as shown at 218. This step may be implemented as a pair of pixel-wise multiplications. Again, refinements are possible, such as choosing to clamp the total correction, i.e., clamping the product of the TX and RX correction factor slices.

FIG. 2 illustrates an exemplary process flow where the items in boxes mainly show entities (images, other data, results of computations) and the "processing" corresponds mainly to the arrows, or to the groups of input arrows coming into a box. The boxes 204, 206 including "TX or RX map" correspond to a single estimate of the RF field non-uniformities, and are utilized in two methods. In one case, a TX field is used to facilitate TX image correction (along the arrow descending to the left box 208). In another case, the same "TX or RX map" is utilized as an RX non-uniformity field to facilitate generating an RF RX uniformity effect correction at 210.

The other processes depicted in FIG. 2 are conventional target image acquisition via an AC with specified MRI sequence parameters and specified slice geometry (at 212) generation of MAP image data from both the WBC and the AC—and slicing of same at 200, 214, 216. In a conventional intensity correction process, the WBC and AC MAP slice data would be used in an RX correction process at 210 to produce an intensity corrected target image at 218. There, a simple WBC/AC ratio was typically used based on the assumption that the WBC B1 RF field was uniform. Now, a fitted model and separate TX and RX corrections provide enhanced correction for high field MRI.

The target images, as represented in 212, may represent some intermediate stage of the complete image reconstruction process for the target acquisition. Consider that matching of geometric locations between MAP pixels and target pixels is one typical component in this correction method. It may be computationally advantageous to assume that MAP scans are stored without geometric distortion correction for gradient hardware imperfections. In such a case, it would also be computationally beneficial to perform the TX correction and the RX correction at some intermediate step in the overall reconstruction of the target image before any gradient distortion correction has been performed. Such considerations can be taken into account, when choosing at what stage in an existing reconstruction process it may be most beneficial to perform these RF uniformity corrections.

The human operator of the MRI scanner can be given a choice as to whether or not the correction is performed. The operator may view uncorrected images and can be given independent control of whether or not RX non-uniformity and/or TX non-uniformity are corrected.

Correction can have a "roll-off" as a function of target intensity (or target image local signal-to-noise ratio (SNR)). Areas of very low SNR are preferably not boosted too high, and do not make the overall image appear too noisy. With such an embodiment, areas of high signal or high SNR are fully corrected, but areas of low signal and low SNR are only fractionally corrected. This correction fraction varies smoothly across the image so as not to introduce discontinuities or abrupt steps.

The operator may enter a basic description of the overall anatomy region (e.g., "head" or "abdomen" or "pelvis"). According to this choice, a predetermined model for the overall expected RF non-uniformity pattern is used. If desired, besides the model being chosen, additional parameters specific to the optimization algorithm may also be chosen to assist in the convergence of the model fitting optimization step.

Optionally, the operator may specify nominal MRI parameters, such as a nominal T1 value or a nominal T2 value.

Optionally, the MAP prescan sub-sequence can include a small number of additional pulses to estimate a nominal T1 value, a nominal T2 value, or the like. However, to keep prescans fast, these may be done without imaging, for example, on the whole volume or the volume as loosely prescribed by the receive AC coil's intrinsic sensitivity.

Optionally, the shape modeling and fitting can be done using only one coil or coil set, which happens to be the same as the coil used for the target scan. It is not essential that there be distinct coil set images for both AC and WBC. The process can be adapted, for example, for use when only a WBC is employed.

Optionally, a user might specify different fractions of correction, for TX, for RX, or a general term to simultaneously control both.

Explicit compensation can be built in for a basic TX or RX pattern of WBC, e.g., a dominant z-axis roll-off as expected in vacuum. The model may include aspects that encompass two distinct mechanisms. There may be one part that describes an interference pattern, perhaps loosely called the "dielectric resonance", associated with the patient, as if the applied external field would be completely uniform in the absence of the patient. There may be a second part that, in general, describes the spatial non-uniformity association of a coil, without a subject. For example, there might be a characteristic roll-off in the z-direction that describes the WBC. One could think of such a model as containing a "coil-specific" part and a "patient-specific part", and the two parts could be combined, e.g., by multiplication. Although this ad hoc decomposition is not, in principal, as exact as a full joint electromagnetic model of both the coil and the patient, it still can be a useful model. In such a joint model, the parameters associated with the patient-specific part can be fitted from the MAP scan on the patient, and the parameters for the coil-specific part can be completely determined in advance, perhaps by electromagnetic modeling.

The exemplary intensity correction process uses a MAP scan, which is the same MAP scan that would already likely be required for other reasons, such as for parallel imaging reconstruction or for older, simpler 1.5 T image correction methods. That is, no additional prescan time is typically required.

The exemplary process removes the dominant shape of both TX and RX sources of error, especially for human applications such as head or body imaging at 3.0 T. It is also suitable for imaging situations in which the dominant source of error comes from the patient, and automatically adjusts for how that error varies from patient-to-patient.

The exemplary embodiment does not introduce new fine detail that could potentially be erroneous or artifacts mistaken for true structure in the image. It also does not require additional hardware, such as more transmit channels. Nor does it typically incur costs of extra scan time or extra SAR.

Corrections generated by this invention should not take unexpectedly different shapes for different target image pulse sequences. Instead, different pulse sequences can be compared, with confidence that algorithm details such as the shape fitting are identical, being derived from a single common map acquisition, independent of the target image details.

Figure 3A:
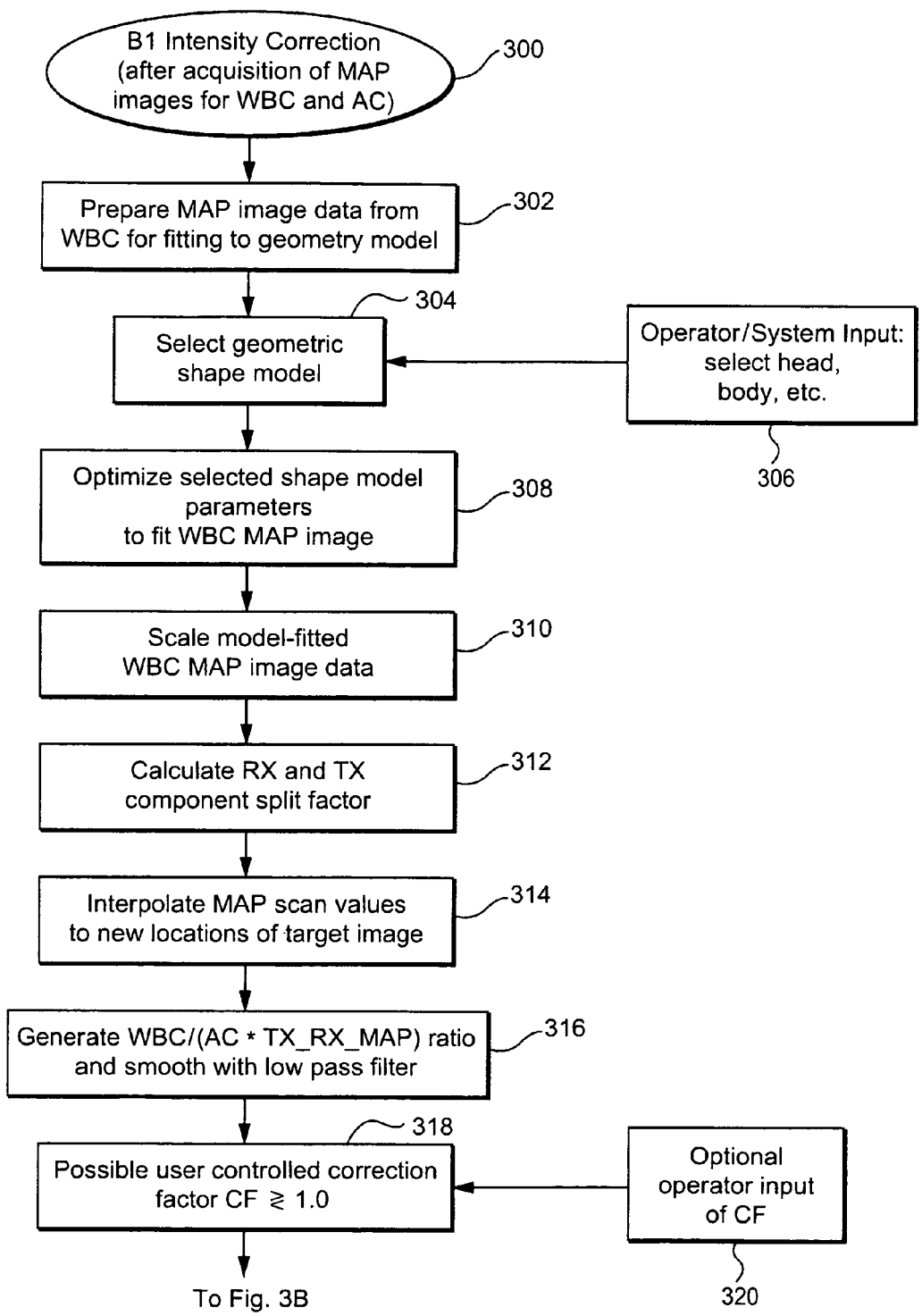
FIGS. 3A-3B provide a schematic flow chart of exemplary RX and TX intensity correction processes.

An exemplary B1 intensity correction process is entered at 300 in FIG. 3A (after acquisition of MAP images for the WBC and the AC).

To prepare the MAP WBC data for model-fitting at step 302, the volume can be sampled or resampled isotropically. Often, the MAP images may have thick slices or thick slice spacing compared to pixel size inside each 2D field of view (FOV).

If there is a convention in scan positioning that forces MAP scans not to be oblique, and if there is a convention that forces the slices to be uniformly spaced, then the reslicing can be a simple linear interpolation in the slice direction, which will probably always be the z direction, or one could require that the MAP is not oblique, and that it has certain orientations to it, etc.

It would be possible to skip this re-sampling step by using more complicated computations to account for non-uniform spacing in the volume.

Another preparatory step associated with the MAP acquisitions is to generate a mask or a threshold, to separate areas with relatively reliable signal intensities for underlying tissue, from areas which are more likely noise or artifact. For example, pixels that are probably tissue can be identified. A threshold level can be chosen that leaves very few pixels outside of the subject. Leaving a few should not matter because of the erosion to be effected thereafter.

In particular, such erosion (to provide a mask map) may remove edges to improve the quality of fit (e.g., especially in the brain). This reduces pixel level variation from other sources, which are not basic RF field patterns, including susceptibility artifacts and partial volume effects. The number of pixels to erode can be chosen in the brain to remove most of the skin, scalp, bone and sinuses. If some brain tissue is also removed, that also may be acceptable. The remaining pixels in the mask should be pixels for which there is a high degree of confidence that they are brain tissue or interior tissue.

The intensity of pixels may also be normalized and converted to floating point form, if not already done, which helps put the amplitudes of the MAP data into an expected range for the later optimization process.

For optimization, it is always best to start as close to the optimum as possible. Starting farther away slows down the optimization process, but more importantly it greatly increases the chance of finding some other unexpected local minimum. Thus, by scaling the amplitude of the MAP data before it is used to have a peak or mean near 1.0, the optimization may favorably utilize a starting estimate assumption that amplitudes will be near 1.0.

Depending upon the region of anatomy at issue, a mathematical model is selected at 304, 306 to represent the broad central part of the WBC MAP. Then an optimization of the model parameters is performed to fit the model to the actual WBC MAP image. There may be one model for brains and heads, and one model for body/abdomen/spine/pelvis. More and/or different models for each region of anatomy may, of course, be added.

Each possible model to be selected has several defining parameters (e.g., such as amplitudes, widths and centers). A standard optimization search is used at 308 to find the values of the parameters for the selected model that make a best fit to the WBC MAP data. For example, the famous Nelder-Mead optimization can be used where the basic cost function that should be minimized is the variance between the model (evaluated with a set of parameters) and the WBC MAP (e.g., using pixels only in the masked area).

Initializing any fixed parameters is important, since these parameters are not refined by optimization. Initializing parameters to be optimized is less critical, since the optimization should yield a good value at the end, but if a better initialization is used, then the optimization routine should converge more quickly, with fewer iterations.

The fitted data should preferably have a value that correlates to an absolute flip angle, not just relative maps.

Later, when the MAP model fitted signal is split into a transmit TX factor and a receive RX factor, it is desirable to have a guess of an appropriate absolute B1 TX factor. Note that for B1 RX corrections, it is possible to only use relative ratios of B1 RX factors, but for TX corrections, it may be important to know at least an approximation of the flip angle.

Typically, an RF level calibration is supposed to make a choice of B1 TX intensity that is consistent from patient-to-patient. If the B1 TX field was spatially uniform everywhere, typically it would be chosen to produce a reference 90° flip angle everywhere. However, when there is spatial non-uniformity of B1 TX, B1 RX and non-uniform tissue parameters, there may be no clear definition of the spatially weighted signal one wishes to optimize. Practical methods for setting the RF level, or the exact details of what RF level will be expected, may differ with distinct MRI scanner system designs.

Therefore, a rough approximation is made at 310 of what the typical expected B1 TX field strength is in typical brains and bodies (e.g., relative to acquired data sets to be used as references). As just one plausible method for determining RF levels, representative B1 TX maps may be acquired separately (e.g., with a SPAMM DUAL FASE sequence) and evaluated in all three imaging planes (axial, sagittal and coronal) and used to normalize other data sets thereto.

The pixel values in the MAP (either the raw version or the fitted model version) have a dependence on both B1 RX and B1 TX. Here, a factor is provided that indicates how much the image intensity varies as a function of the B1 factor (but only for the B1 MAP scan).

The assumption is made that the inhomogeneity of the B1 TX field is the same as the inhomogeneity of the B1 RX field.

This assumption is just an approximation—it is not 100% true. Then a calculation is made to determine how much the typical signal will vary due to both RX and TX effects combined for a range of inhomogeneity amounts. Then this is fitted.

For example, maybe in the head, with a simple linear fit, the relative signal change is about 1.4 times the relative inhomogeneity. This number is inverted, and one can then assume that the relative inhomogeneity in a TX RX MAP will be about 0.7 times the relative change in the WBC MAP image. In this example, the value 0.7 may be called the "split factor", as it can be used to determine how much of the deviation from uniformity in the fitted map would be attributed to the RF RX field non-uniformity effect. More generally, the split factor can be a function of the non-uniformity or spatial inhomogeneity in the map image.

The fit could be done with a linear regression instead of a higher order fit. A higher order fit might improve the inversion and replace the linear slope of the split factor with a low order polynomial expression, like a quadratic. But this may not be very important, and there may be no real need to use a higher order fit. However, there is no harm in using the quadratic fit.

Next, for each pixel location, the TX RX MAP value for that location is computed at 312. First, the value of the fitted model is calculated for each pixel. Then using the split factor, the deviation from "1.0" in the fitted model is converted into a corresponding deviation from "1.0" in the TX RX MAP.

A smoothed 3D low resolution map for the model was previously generated. It would be possible to generate this new TX RX MAP by first doing an interpolation from the low resolution map. Instead, a forward computation may be made from the model formula and model parameters at each pixel location. One reason to do the forward recalculation of the model is that it handles the case where the geometry extends outside of the area where the WBC MAP data was acquired.

The values of the MAP scans are next interpolated at 314 from the pixel locations of the MAP scans to the new pixel locations of the target image.

The ratio of the WBC map divided by the AC map is formed and a low-pass filter smoothing (e.g., a mean over a 7×7 pixel square neighborhood) is effected at 316 before this ratio is divided by the TX RX MAP. However, the smoothing may alternatively be performed on the separate WBC and AC maps before taking the ratio. Here the MAP is treated as if it is the estimate of the B1 RX map. This reduces or removes the central intensity (shading) error that happens because the WBC MAP image does not have a uniform spatial receive sensitivity.

The division by TX RX MAP is a major improvement provided by the exemplary process. The remaining processes provide TX correction, but the RX correction may be more important.

If the user asks at 320 for a stronger RX correction factor greater than 1.0, the MAP may be modified at 318 so that all of the RX correction factor values are farther away from 1.0.

If the user asks for a correction factor=1.0, then the RX correction applied will be exactly what has been estimated from the above theory and approximations. That is, the TX correction factor will be the same as the previously calculated ratio.

For the target image pulse sequence and for the most typical tissue parameters in the chosen anatomy region, the amount of signal level changes are computed at 322 (based on MRI sequence information input at 324) when the B1 TX is too high or too low for a few discrete values of B1 TX. This is only for TX effects, and ignores RX effects. It would be possible to generate this from Bloch equation simulations. Instead, it can also be accomplished from formulas in textbooks for the most important pulse sequences.

The modeled signal level is fitted as a function of TX inhomogeneity at 326. When the TX RX MAP factor is 1.0 and the tip angles of the sequence are all exactly what the user has requested, this signal level is normalized and rescaled to be 1.0.

A quadratic polynomial fit may be used with a standard fitting routine.

Figure 3B:
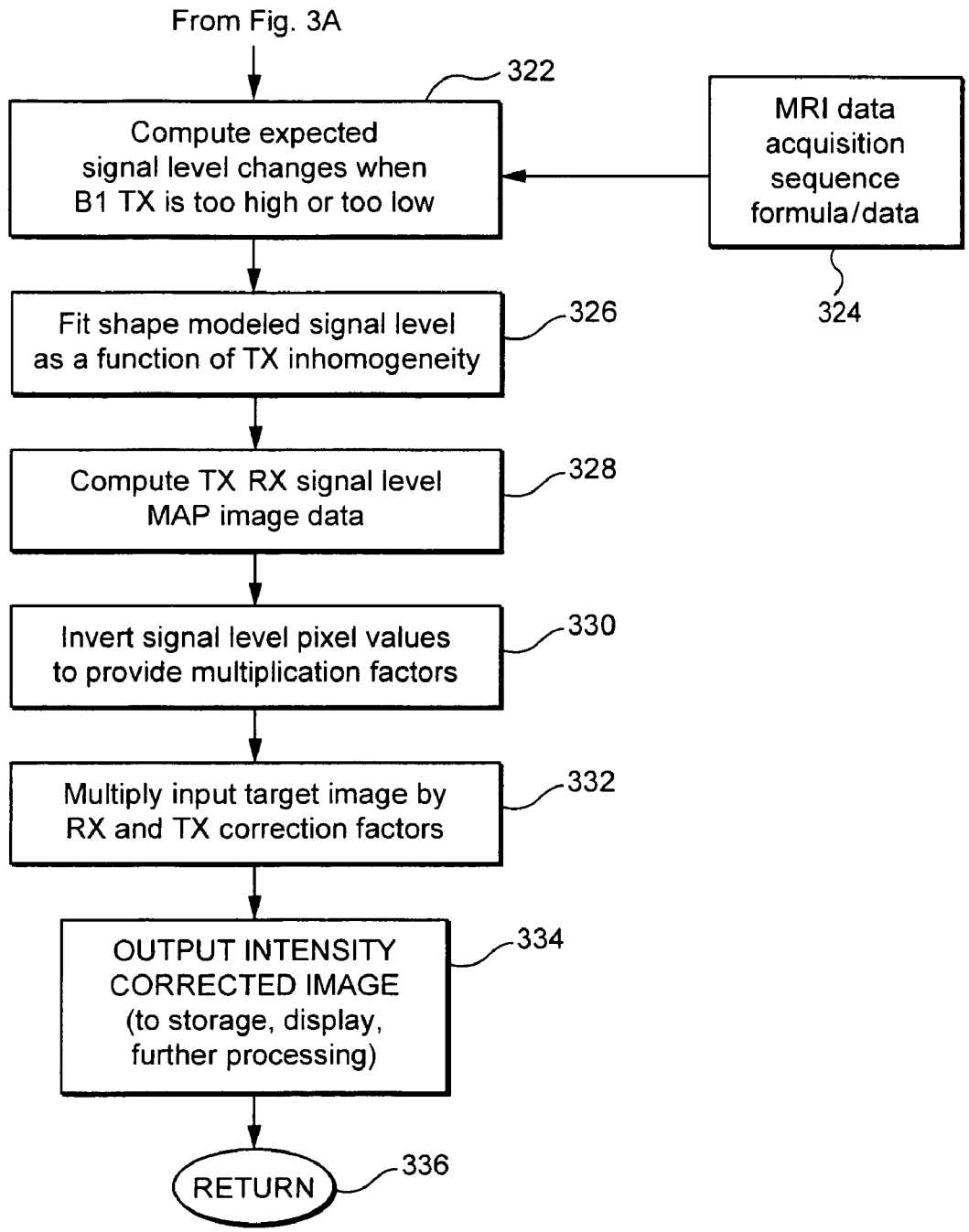
Figure 4:
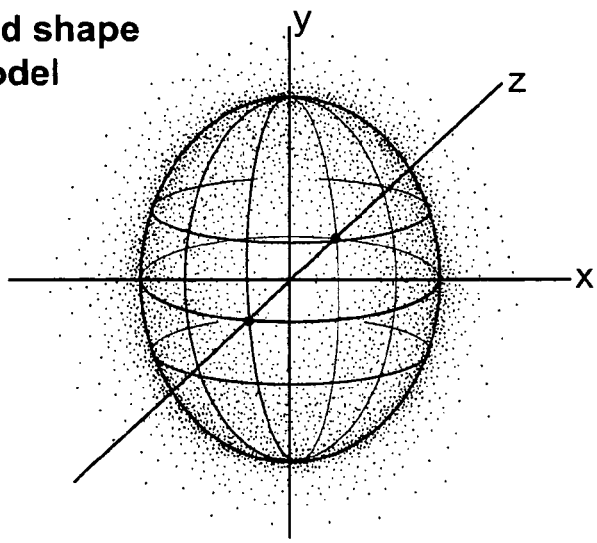
FIGS. 4 and 5 are schematic diagrams of exemplary head and body geometric shape models to which MAP scan data is fitted in the exemplary embodiment of FIGS. 3A-3B.
Figure 5:
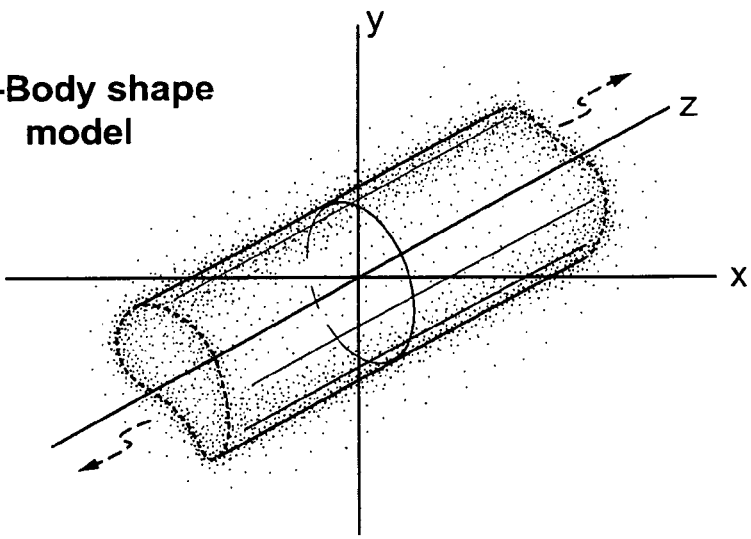

At every pixel location in the target image, the value of the TX RX MAP is subjected to the polynomial at that pixel location (to generate a map that is proportional to the brightness of target image caused by TX non-uniformity), and the result is stored as a new pixel value (step 328 in FIG. 3). This map shows how the ideal signal is expected to deviate because of broad general TX map effects.

The signal level pixel values are now inverted to provide values that can be used as a multiplication factor to do a basic TX correction (step 330). Very strong corrections should be avoided in favor of a smooth taper function. Corrections should be controlled to not exceed a certain limit.

It is possible, especially with SE and FSE, that a B1 TX factor that varies by 40% can have a signal decreased by over 70%. Then if a polynomial is fitted to this, one might expect that a B1 TX factor that varies by 50% could be extrapolated to have a signal level near zero. Then, the correction factor like f=1.0/(tiny) would be huge. If there are nearly-infinite pixels in the image, everything else may be scaled to look black.

To avoid this kind of extreme effect, a clamp effect may be used. For example, a hyperbolic tangent function (TANH) can be used. Another reasonable function to reduce very high values and very low values may involve a smooth saturation curve. If the clamp functions are smooth, the user should never sense a spurious line or an edge or boundary, which can sometimes appear if simple thresholding is used for limits.

Finally, at 332, the input target image is multiplied by two correction factors, RX and TX as previously computed.

The intensity corrected image is output at 334 and program control is returned to the module calling code at 336.

The processing should not cause new "structure" to appear in an image. The only changes in the image from the processing are very smooth (e.g., correction to gradual shading effects). Nothing from the intensity correction processing should generate any appearance that might be mistaken as small pathology lesions. Whenever there is a tradeoff in an algorithm between average accuracy of the corrections versus preventing local bright or dark spots, the methods of this processing are chosen so that there should be no local bright or dark spots.

The processing cannot correct for details like failed fat saturation, failed spatial saturation or incorrect flow sensitivity.

In the exemplary implementations given so far, a practical implementation choice is to assume that the RF RX inhomogeneity map and the RF TX inhomogeneity map are identical. This assumption is not essential. Consider that the human body routinely includes a high degree of left-right symmetry. As is well known, the RF TX field and the RF RX field exhibit reverse rotational polarities. At least for a radial WBC design, the TX field and the RF field may well be described as left-right mirrored versions of each other, to the extent that the patient has significant left-right symmetry. In the event that the model of the RF fields does include some right-left asymmetry, then it is reasonable to assume that the RX and TX field will be mirrored copies of each other. Therefore, in principle, a single fitted model, which contains some non-mirrored components, could be split so as to decompose the inhomogeneity of a reference MAP scan into mirror-symmetric TX RF and RX RF field volume maps.

The exemplary intensity correction algorithm will not improve contrast between tissues in a local area. If, for example, gray/white contrast is reduced in the center of the brain because transmit pulses are far from optimum, the TX correction will not restore this contrast. It can only fix an average brightness over a broad area. However, sometimes it might seem like the contrast gets better. This can happen when the corrected image has better overall uniformity across the whole FOV. Suppose a whole section of the uncorrected image is too bright. Once this area is made less bright, it may be possible to window and level the image better. With better window and level, it is easier to see all the contrast that is present. Because of this effect of choosing different windows and levels in image viewing, it can be difficult to perceive how much contrast is really in an image.

The algorithm does not eliminate the effect of very local bright spots or dark spots where the anatomy is very close to a coil conductor element. More often, the anatomy is bright very close to a conductor. However, sometimes the anatomy has a dark line where two nearby coil elements overlap and are out of phase with each other. The RX correction will reduce these effects a little, but the smoothing may be such that variations that happen over distances of maybe 2 cm or less are not removed.

In some coil arrangements, there are imaging planes that are already very uniform. The intensity correction algorithms cannot improve them, if they are already very good. Sometimes this happens with a coronal slice in the body for some slices between the spine array and the anterior body array.

For some pulse sequences, it is possible that the TX dependence and the RX dependence are almost exactly the opposite of each other. These images are already very good, and cannot be improved much.

It may be useful to slightly modify the typical prescan MAP sequence. For example, the sampling bandwidth might be increased (e.g., from 488 Hz/pixel to 976 Hz/pixel). This may improve the uniformity of body FE MAP scans by reducing chemical shift. Often in a pelvis, fat in-plane mis-registration can be one of the largest effects for making the maps non-uniform. The maps may look better when they use higher readout bandwidth. 976 Hz/pixel might be thought of as a high readout bandwidth for most imaging sequences, but the MAP scans typically have very large pixels. Thus, 976 Hz/pixel may be a fairly short readout time, but it still uses a readout gradient that is quite weak compared to other 3.0 T sequences, and the in-plane chemical shift is large if measured in mm distances.

An exemplary head model is detailed below. For example, a WBC MAP volume scan is fit to a constant+a 3D Gaussian model=$c1+c2 \cdot (\exp(-0.5 \cdot (((x-c3) \cdot c6\_recip)^2 + ((y-c4) \cdot c7\_rcip)^2 + ((z-c5) \cdot c8\_recip)^2))$. Here the variables x, y, and z are pixel indices for the isotropically re-sampled WBC map image.

Head model=$c1+c2e^{-0.5[((x-c3)/c6)^2+((y-c4)/c7)^2+((z-c5)/c8)^2]}$.

The deviation between the map image and the model can be measured only in the areas denoted as tissue in the masking process or masking and erosion processes from step 302, i.e., pixels outside of the mask region may simply be ignored in the fit.

Optimization searches are performed for variables c1, c2, c6 and c7, and c2 is expected to be positive.

Possible starting values for an optimization search for a 3T system may be:
c1=0.45
c2=0.55
c3=x center of mass, as calculated for WBC map
c4=y center of mass, as calculated for WBC map
c5=z center of mass, as calculated for WBC map
c6_recip=4.0/(x width of scan in pixels)
c7_recip=c6_recip
c8_recip=c6_recip.

An exemplary body model is detailed below. For example, a WBC MAP volume scan is fitted to constant+a 2D Gaussian cylinder model=$c1+c2*(\exp(-0.5*(((x-c3)*c6\_recip)^2 + ((y-c4)*c7\_recip)^2)$.

Body model=$c1+c2e^{-0.5[((x-c3)/c6)^2+((y-c4)/c7)^2]}$.

Again, the fitting can be limited to the region of the eroded mask, and pixels outside of the mask may be ignored.

Optimization searches are performed for the variables c1, c2, c6 and c7, and c2 is expected to be negative.

Possible starting values for an optimization search may be:
c1=1.0
c2=−0.3
c3=x center of mass, as calculated for WBC map
c4=y center of mass, as calculated for WBC map
c6_recip=4.0/(x width of scan in pixels)
c7_recip=2.0/(y width of scan in pixels).

As with other corrections involving prescan or calibration data, it may be beneficial to enforce some rules to make data more consistent. For additional processing may check that the patient or the couch have remained unmoved between the time of the MAP scan and the target scan. These sorts of acquisition limitations are widely known in MRI.

While certain embodiments of the invention have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A method for MRI comprising use of an MRI gantry and associated computers and hardware to:
   acquire MRI MAP prescan data from a predetermined imaged patient volume;
   decompose said acquired MAP prescan data to produce a transmit RF field inhomogeneity map and a receive RF field inhomogeneity map for said imaged patient volume based on a three-dimensional geometrical model of said inhomogeneity maps; and
   use at least one of said transmit RF field inhomogeneity map and said receive RF field inhomogeneity map to generate intensity-corrected target MRI diagnostic scan image data representing said imaged patient volume.

2. The method of claim 1, wherein said three-dimensional geometrical model is defined by a closed form mathematical function that has smoothly varying spatial dependence.

3. The method of claim 1, wherein said geometrical model includes a plurality of variable geometric parameter values selected in an optimization process to fit in said predetermined imaged patient volume.

4. The method of claim 3, wherein said geometric parameter values include parameters representing the center and/or characteristic widths in said predetermined imaged patient volume.

5. The method of claim 1, wherein said geometrical model incorporates only smoothly varying spatial dependencies substantially conforming to a Gaussian shape.

6. The method of claim 1, wherein said MRI gantry includes a static magnet producing a static magnetic field of 1.5 Tesla or greater.

7. The method of claim 1, wherein said transmit RF field inhomogeneity map and said received RF field inhomogeneity map are constrained to have a predetermined functional interdependence.

8. The method of claim 7, wherein said transmit RF field inhomogeneity map and said receive RF field inhomogeneity map are identical.

9. The method of claim 7, wherein said transmit RF field inhomogeneity map and said receive RF field inhomogeneity map are mirrored symmetric copies of each other.

10. The method of claim 1, wherein intensity corrections are limited to a lesser relative amount in spatial areas having relatively smaller signal-to-noise ratios such that local noise components are not substantially increased beyond a predetermined amount.

11. An MRI system comprising:
means for acquiring MRI MAP prescan data from a predetermined imaged patient volume;
means for decomposing said acquired MAP prescan data to produce a transmit RF field inhomogeneity map and a receive RF field inhomogeneity map for said imaged patient volume based on a three-dimensional geometrical model of said inhomogeneity maps; and
means for using at least one of said transmit RF field inhomogeneity map and said receive RF field inhomogeneity map to generate intensity-corrected target MRI diagnostic scan image data representing said imaged patient volume.

12. The MRI system of claim 11, wherein said three-dimensional geometrical model is defined by a closed form mathematical function that has smoothly varying spatial dependence.

13. The MRI system of claim 11, wherein said geometrical model includes a plurality of variable geometric parameter values selected in an optimization process to fit in said predetermined imaged patient volume.

14. The MRI system of claim 13, wherein said geometric parameter values include parameters representing the center and/or characteristic widths in said predetermined imaged patient volume.

15. The MRI system of claim 11, wherein said geometrical model incorporates only smoothly varying spatial dependencies substantially conforming to a Gaussian shape.

16. The MRI system of claim 11, wherein said MRI gantry includes a static magnet producing a static magnetic field of 1.5 Tesla or greater.

17. The MRI system of claim 11, wherein said transmit RF field inhomogeneity map and said received RF field inhomogeneity map are constrained to have a predetermined functional interdependence.

18. The MRI system of claim 17, wherein said transmit RF field inhomogeneity map and said receive RF field inhomogeneity map are identical.

19. The MRI system of claim 17, wherein said transmit RF field inhomogeneity map and said receive RF field inhomogeneity map are mirrored symmetric copies of each other.

20. The MRI system of claim 11, wherein intensity corrections are limited to a lesser relative amount in spatial areas having relatively smaller signal-to-noise ratios such that local noise components are not substantially increased beyond a predetermined amount.

* * * * *